(12) United States Patent
Trimberger

(10) Patent No.: US 6,625,794 B1
(45) Date of Patent: Sep. 23, 2003

(54) METHOD AND SYSTEM FOR SAFE DEVICE RECONFIGURATION

(75) Inventor: Stephen M. Trimberger, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 150 days.

(21) Appl. No.: 09/707,365

(22) Filed: Nov. 6, 2000

(51) Int. Cl.[7] ................................................ G06F 17/50
(52) U.S. Cl. ..................... 716/16; 716/16; 716/17; 326/38; 326/41; 326/39
(58) Field of Search ............................... 326/41, 38, 39; 365/201; 703/14, 23; 709/226, 246; 710/72, 240, 305; 716/1–21; 712/43; 713/1; 714/33, 39

(56) References Cited

U.S. PATENT DOCUMENTS

| 4,975,601 | A | * | 12/1990 | Steele .......................... 326/38 |
| 6,308,311 | B1 | * | 10/2001 | Carmichael et al. ........... 716/16 |
| 6,331,790 | B1 | * | 12/2001 | Or-Bach et al. ............... 326/41 |

* cited by examiner

Primary Examiner—Vuthe Siek
Assistant Examiner—Helen B. Rossoshek
(74) Attorney, Agent, or Firm—Adam H. Tachner; Lois D. Cartier

(57) ABSTRACT

A novel method and corresponding system are provided for safely reconfiguring a portion of a reprogrammable logic device. The method includes the steps of identifying the nets to be reprogrammed, identifying the device drivers that may induce signal contention during or after a new configuration on the identified nets, electrically isolating the identified drivers, and implementing the new configuration.

26 Claims, 5 Drawing Sheets

METHOD AND SYSTEM FOR SAFE DEVICE RECONFIGURATION

FIELD OF THE INVENTION

The present invention relates generally to the field of reconfiguring reprogrammable logic devices, and more particularly to avoiding signal contention within a partially reprogrammable logic device, such as a field programmable gate array (FPGA).

BACKGROUND OF THE INVENTION

Signal contention can be defined as the simultaneous driving of two or more different signals across a single electrical conductor. Signal contention can cause a full spectrum of problems, from short-term output errors to full-scale device malfunctions. For example, in reprogrammable logic device 100 illustrated in FIG. 1, simultaneously driving a single "net" 104 in interconnect network 102 with both a 1 and a 0 at any one of the illustrated configurable logic blocks ("CLBs" CLB1, CLB2, and CLB3) or interconnect points 103 can cause a large current drain. This current drain can heat up the device and possibly burn it out.

One available technique for eliminating the risk of interconnect signal contention in reprogrammable logic devices (such as the XC4000 device illustrated in part in FIG. 1, available from Xilinx, Inc., assignee of the present invention) comprises performing a pre-implementation analysis of a software file representing a configuration to be programmed into the device. If the analysis reveals an unacceptable likelihood of signal contention within the intended device, the data file is rejected and cannot be loaded into the device.

While this technique is effective for older devices wherein all the memory cells must be re-written in order to change any portion of the configuration of the device, a new generation of partially reprogrammable devices renders this and all other known techniques deficient. Unlike a device that can only be completely reconfigured at any time, reconfiguration of a partially reprogrammable device is often limited to one or more memory cells and interconnect nets on the device. And to further complicate the issue, such partial reconfiguration may occur while operation of the remainder of the device is either temporarily suspended or continuing without interruption (rendering impossible the accurate estimation of net driver status at any point in time).

Thus, partial reprogrammability brings about two situations wherein signal contention is a concern, and for which existing contention-avoidance techniques are insufficient. The risk of signal contention is intolerable if a) any portion of the device is to be reconfigured without a thorough and fully accurate analysis in software form, or b) the unaltered area of the device remains active during the partial reconfiguration, and interacts with the newly configured area in an unanticipated way, even if only during temporary changes of state.

There are some partially reconfigurable devices that obviate signal contention issues by providing only a single driver for any single net. For example, the XC6200 FPGA available from Xilinx, Inc. is such a device. However, such a hardware-based solution significantly limits the flexibility and functionality gained from allowing multiple drivers to potentially (but not simultaneously) drive a single net. A new generation of devices available from Xilinx (known as the VIRTEX™ line of FPGAs) allows reprogrammability without limiting the number of drivers that may drive a single net at different times. Thus, for partially reprogrammable devices such as those included in the VIRTEX line and others, there remains a need for a system and method of avoiding signal contention while enabling partial device reconfiguration with a plurality of potential drive sources on a single net.

SUMMARY OF THE INVENTION

To address the shortcomings of the available art, the present invention provides a novel method and system for safely reconfiguring a partially or fully reprogrammable logic device by either identifying and temporarily isolating those drivers that present a risk of contention, or temporarily isolating the region of the device to be reconfigured from outside drivers. To eliminate the risk of signal contention during reprogramming, the invention comprises the steps of (and structure and means for) identifying the nets to be reprogrammed, identifying the device drivers that may induce signal contention during or after a new configuration on the identified nets, electrically isolating the identified drivers, and implementing the new configuration. In the alternative, the method provides the steps of identifying a region of the device to be reprogrammed, electrically isolating the identified region from drivers outside the region along the border of the identified region, reconfiguring the region, and reintegrating the region into the function of the total device.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

Figure 1:
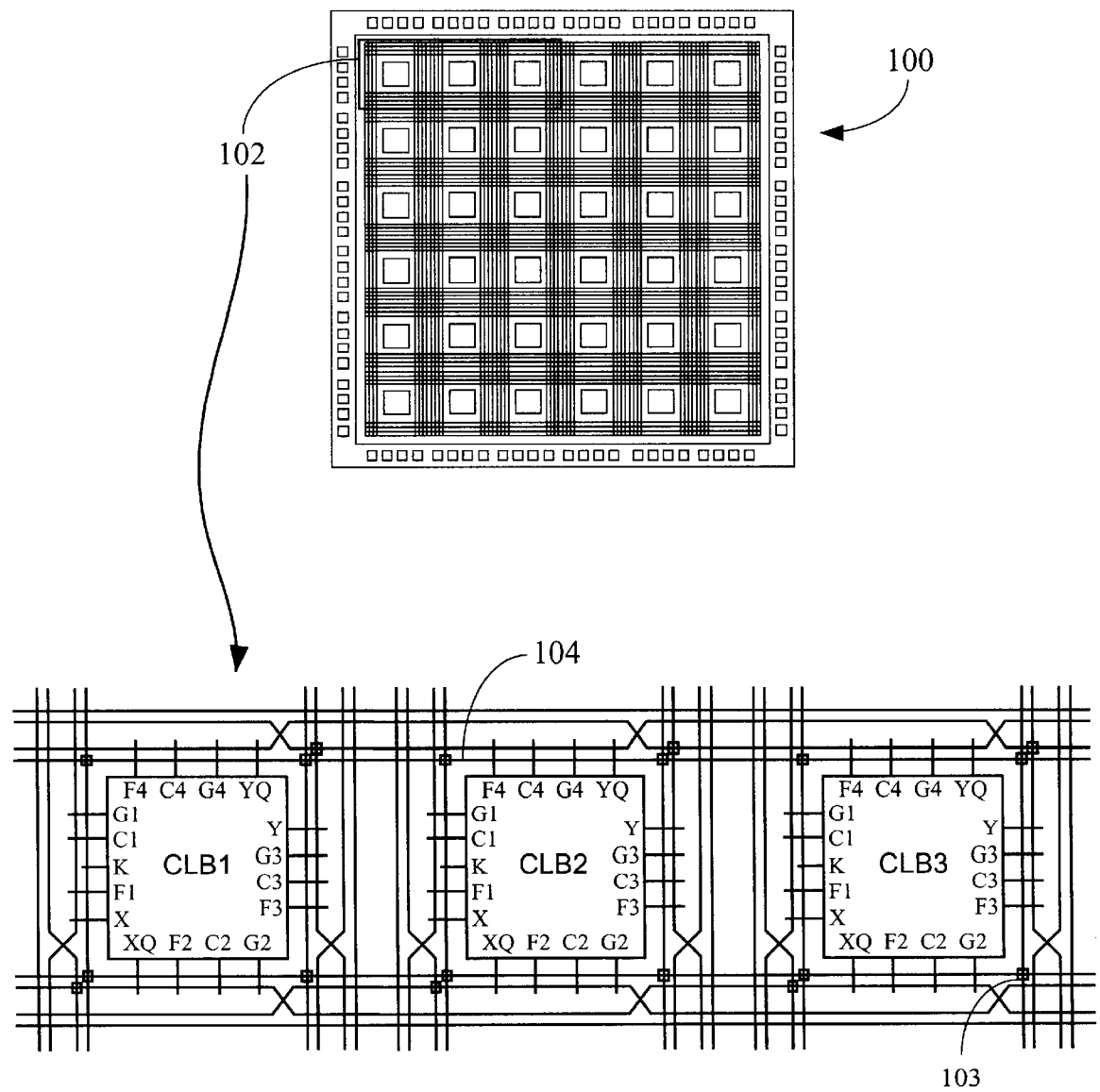
FIG. 1 illustrates an available programmable logic device interconnect matrix.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

Figure 2A:
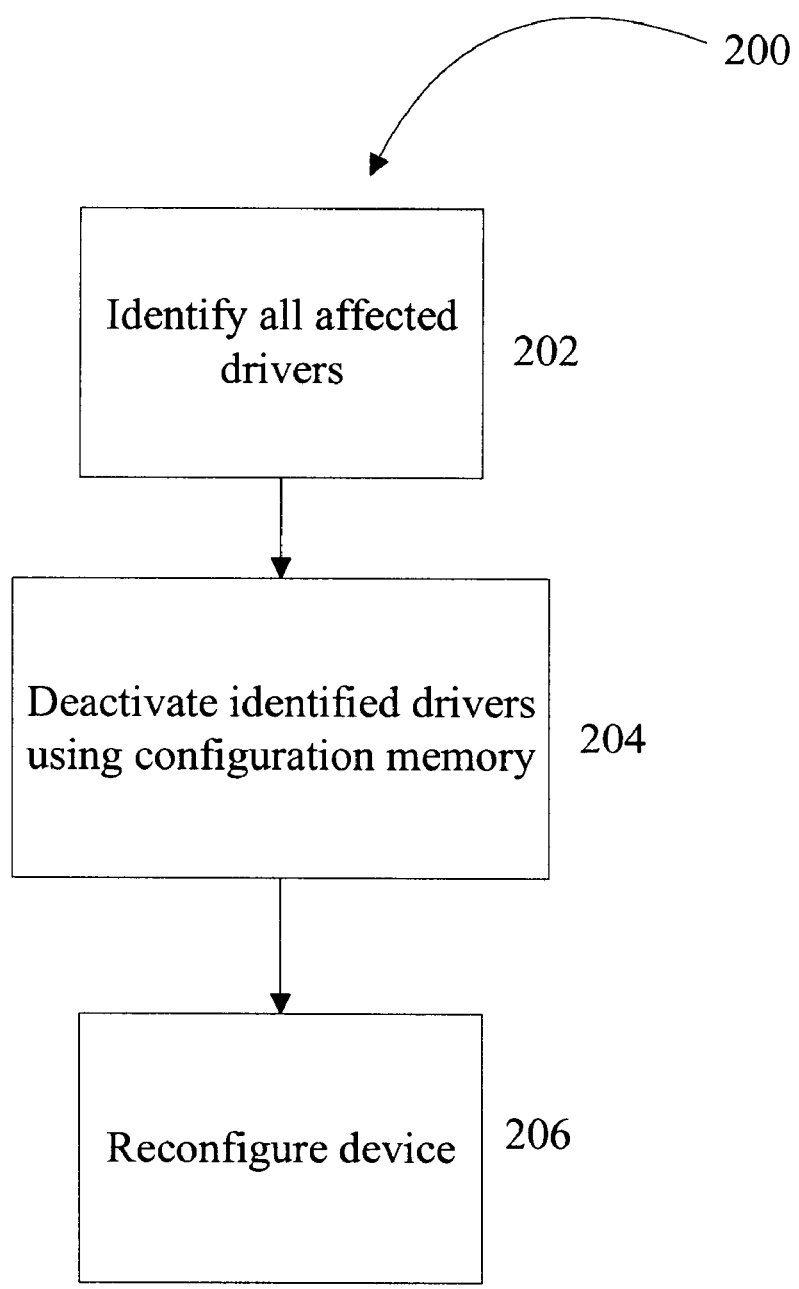
FIG. 2A is a flowchart illustrating a first embodiment of the inventive method.
Figure 2B:
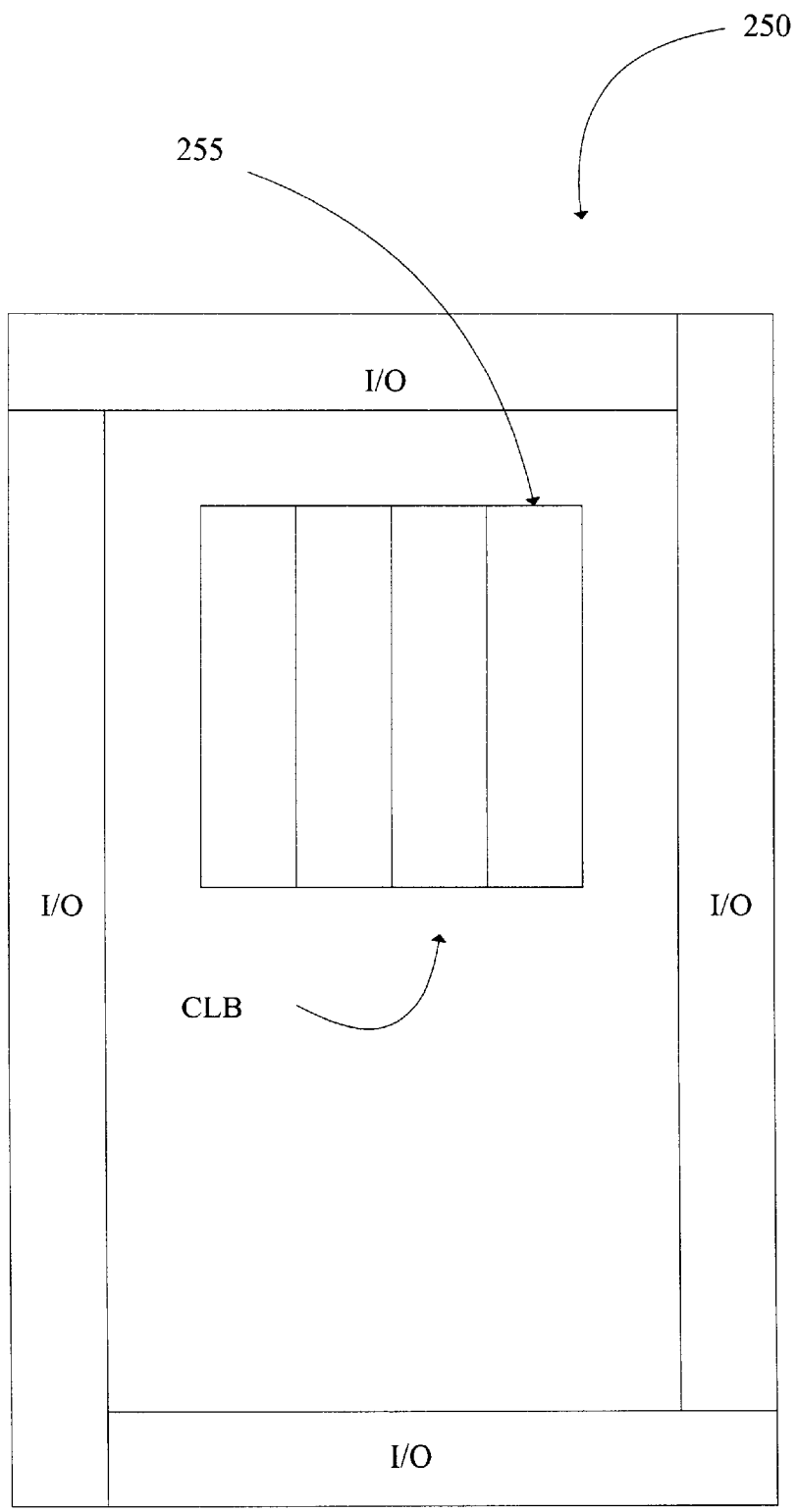
FIG. 2B illustrates a partially reconfigurable device compatible with the method illustrated in FIG. 2A

FIG. 2A shows a flowchart 200 that outlines the steps comprising a first method of the present invention. This method can be practiced, for example, on FPGA 250 of FIG. 2B. In FPGA 250, a device region 255 is targeted for reconfiguration. The targeted device region may, for example, comprise a single memory frame. (A memory frame comprises a physically aligned grouping of memory elements on a programmable device, normally written to as a single unit.) Alternatively, the targeted device region may comprise more than one memory frame.

In the method of FIG. 2A, reconfiguration of device 250 takes place in two primary phases. Once the device region 255 to be reconfigured is noted, at step 202 all drivers located within or driving nets that penetrate the region to be reconfigured are identified. At step 204, the drivers identified in step 202 are deactivated through configuration of memory frames, controlling the identified drivers (phase 1). At step 206, the intended reconfiguration bitstream (the sequence of binary digits used to configure the device, as will be understood by those skilled in the art to which the invention pertains) is loaded into the device, thereby again writing over the memory frames programmed at step 204 (phase 2). While this method requires twice writing to those memory frames responsible for reconfigured driver function, the method completely addresses the need to eliminate the possibility of temporary contention during configuration when one portion of the device remains active.

Figure 3:
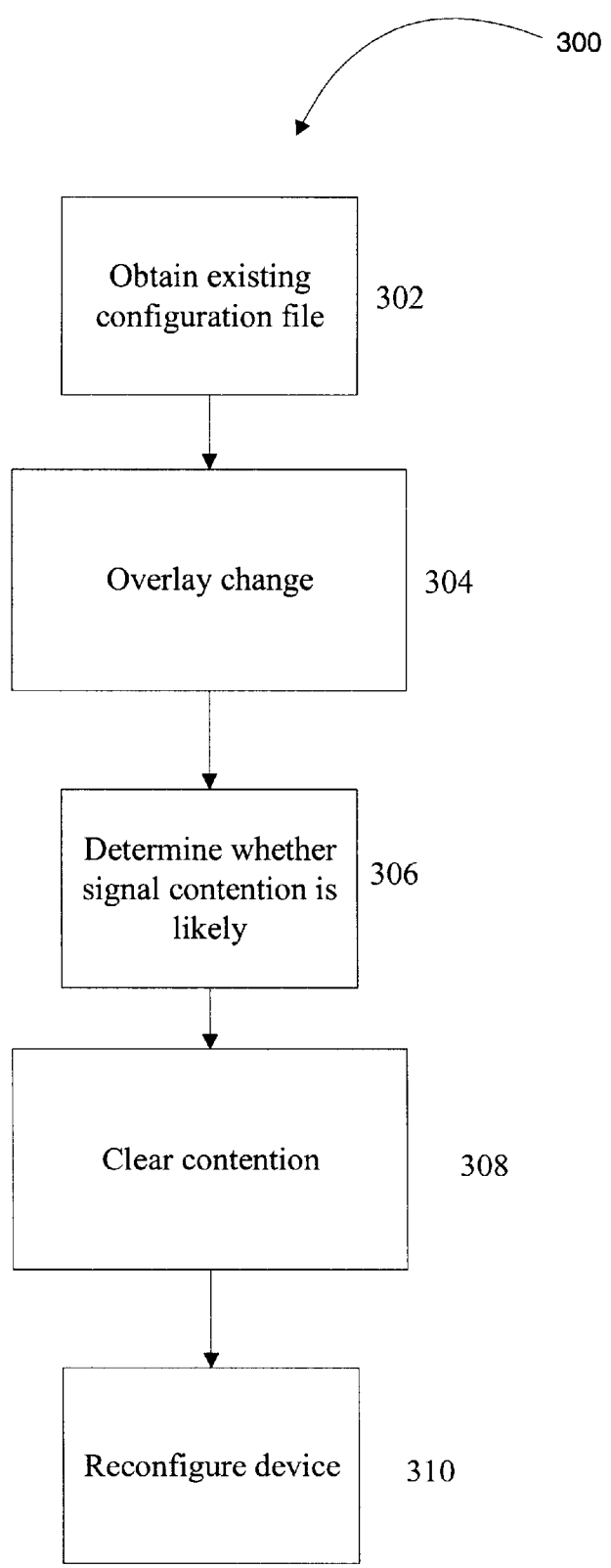
FIG. 3 is a flowchart illustrating an alternative embodiment of the inventive method.

Flowchart 300 in FIG. 3 graphically illustrates a second inventive approach, wherein a newly-programmed portion of a device interacts with a portion that is not reconfigured, thereby enabling the retention of state and programming information in the portion not reconfigured. First, at step 302, the existing configuration bitstream is obtained. Next, at step 304, the portions of the bitstream corresponding to the portions of the device to be reconfigured are compared to the existing device configuration. At step 306, an analysis is performed to determine whether any signal contention will result from the combination of the existing configuration and the newly configured portions. At step 308, drivers potentially involved in signal contention are cleared as outlined above with reference to FIG. 2. Finally, at step 310, the new bitstream is loaded, since all combinations are now contention-free.

Figure 4:
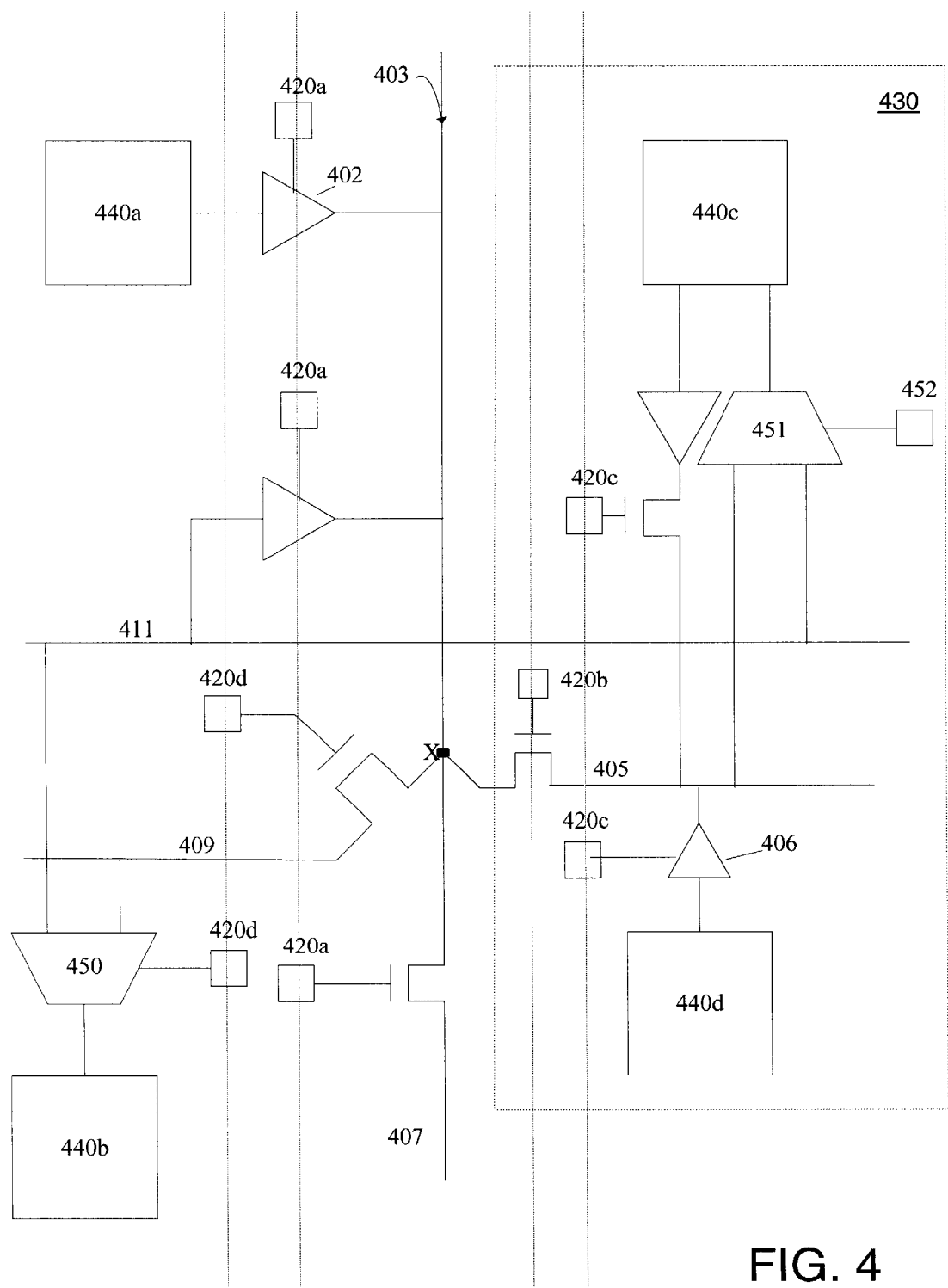
FIG. 4 is a diagram illustrating an interconnect network upon which the method of the present invention can be practiced.

FIG. 4 shows a portion of one interconnect network in which the method of the present invention provides contention-free device reconfiguration. FIG. 4 illustrates a portion of a reprogrammable logic device having programmable logic units 440a–d and programmable interconnect segments 403, 405, 407, 409, and 411. At a given point in time, the current configuration of the reprogrammable logic device is contained in memory cells 420a–d, which are organized in frames. In the figure, as shown by dashed vertical lines, three memory cells 420a are in one frame, one memory cell 420b is in a second frame, two memory cells 420c are in a third frame, and two memory cells 420d are in a fourth frame. Other memory cells in the structure (for example, memory cell 452) are not involved in the reconfiguration. During reconfiguration of this example device, all memory cells in a frame are written simultaneously while other frames remain unchanged.

In an initial configuration of the illustrated portion of the device array, frames of configuration data are written so that driver 402 drives interconnect 403, which is connected with pass transistor connections to drive interconnect segments 409 and 405. Multiplexers 450 and 451 are configured to provide the signals carried by interconnect segments 409 and 405 to logic units 440b and 440c, respectively. Reconfiguration of region 430 requires logic unit 440d to drive interconnect 405 into logic unit 440c. If driver 406 is activated, contention may occur between drivers 406 (within the region to be reconfigured) and 402 (outside the region to be reconfigured) across interconnect segments 403 and 405 through point X.

In accordance with the method of the invention, the frame corresponding to memory cells 420a is overwritten, disabling driver 402. Drivers of other signals that enter region 430 are also disabled by writing to the appropriate driver configuration memory. Next, region 430 is reconfigured to allow driver 406 to drive interconnect line 405. As part of this reconfiguration, memory cell 420b is turned off to disconnect interconnect 405 from interconnect 403. Finally, driver 402 is turned back on by writing the configuration frame corresponding to the memory cells 420a a second time.

In another embodiment of the present invention, first the frame corresponding to memory cell 420b is written to separate interconnects 403 and 405. Then, all configuration cells in region 430 are written. Thus, all memory cells corresponding to wires that cross the boundary into a reconfigured area are configured to disconnect the reconfigured area before reconfiguring that area. After the reconfiguration is complete, the memory cells are re-written to re-establish connections where needed. In an alternate embodiment, only wires where contention might occur are disconnected.

In still another embodiment, the steps for reconfiguring area 430 are ordered so that potential contention is avoided by writing to frames that disconnect interconnect (for example, 420b) before frames that drive segments (for example, memory cells 420c).

Although the present invention has been shown and described with respect to preferred embodiments, various changes and modifications lie within the spirit and scope of the claimed invention. For example, in the embodiment described above, the driver isolation technique need not have the exact characteristics described, but need only protect against identified risk of signal contention across a net in any fashion. Thus, the corresponding structures, materials, acts, and equivalents of all means or step plus function elements in the claims are intended to include any structure, material, or acts for performing the functions in combination with other elements as specifically claimed.

What is claimed is:

1. In a reprogrammable logic device having programmable logic units and multiple drivers for delivering logic signals to the logic units, a method of reprogramming the logic units with a new configuration, the method comprising:

identifying the logic units to be reprogrammed;

identifying the drivers forwarding logic signals to the identified logic units;

electrically isolating the identified drivers from the identified logic units; and programming the new configuration into the identified logic units.

2. The method of claim 1, wherein electrically isolating the identified drivers from the identified logic units includes writing configuration data.

3. The method of claim 1, wherein identifying the drivers includes identifying all drivers of wire segments driven by a driver in the new configuration.

4. The method of claim 1, wherein programming the new configuration into the identified logic units comprises:

writing only those drivers affiliated with the new configuration to an electrically-isolated state;

configuring the remainder of the identified logic units; and writing drivers that will drive in an ON state.

5. In a reprogrammable logic device having programmable logic units and interconnects connecting the programmable logic units to other portions of the device, wherein a first region of the device may be reprogrammed while a second region of the device continues to operate, a method of reprogramming the first region of the device with a new configuration, the method comprising:

identifying logic units in the first region to be reprogrammed;

identifying drivers in the second region that forward logic signals to the identified logic units in the first region;

electrically isolating the identified drivers from the identified logic units; and reprogramming the first region of the device with the new configuration.

6. The method of claim 5, wherein electrically isolating the identified drivers from the identified logic units includes writing configuration data.

7. The method of claim 5, wherein identifying drivers includes identifying all drivers of wire segments driven by a driver in the new configuration.

8. The method of claim 5, wherein reprogramming the first region of the device comprises:

writing only those drivers affiliated with the new configuration to an electrically-isolated state;

configuring the remainder of the first region of the device; and writing drivers that will drive in an ON state.

9. In a reprogrammable logic device having a first region in which reprogrammable logic units are located and having a second region in which there are no reprogrammable logic units, the first and second regions being interconnected by programmable interconnects, a method for reprogramming the reprogrammable logic units while avoiding signal contention problems, the method comprising:

identifying the reprogrammable logic units to be reconfigured;

identifying the interconnects connecting the identified logic units with the second region;

programming the identified interconnects to electrically isolate the identified logic units from the second region;

reconfiguring the identified logic units; and programming the identified interconnects to reconnect the reconfigured logic units to the second region.

10. The method of claim 9, wherein programming the identified interconnects to electrically isolate the identified logic units from the second region includes writing configuration data.

11. The method of claim 9, wherein identifying the interconnects includes identifying all drivers of wire segments driven by a driver in the new configuration.

12. In a programmable logic device having reprogrammable logic units and drivers connected to the logic units for delivering logic signals to the logic units, a method for reconfiguring at least one of the logic units with a new configuration in a manner substantially free of signal contention, the method comprising:

identifying the at least one logic unit to be reconfigured;

identifying a plurality of drivers associated with the identified logic unit;

deactivating the identified drivers;

reconfiguring the identified logic unit; and reactivating the identified drivers.

13. The method of claim 12, wherein the step of deactivating includes writing configuration data.

14. In a programmable logic device having reprogrammable logic units of which at least one such unit is to be reprogrammed, a method of performing such reprogramming while avoiding signal contention problems, the method comprising the steps of:

determining an initial configuration of the device;

comparing the initial configuration with a reprogrammed configuration of the device;

determining whether any signal contention will result from the combination of the initial configuration and the reprogrammed configuration;

deactivating logic device components to clear any determined signal contention;

reprogramming the device to the reprogrammed configuration; and reactivating the deactivated components.

15. A reprogrammable logic device having programmable logic units and multiple drivers for delivering logic signals to the logic units, the logic units being reprogrammable with a new configuration, the device comprising:

means for identifying logic units to be reprogrammed;

means for identifying drivers forwarding logic signals to the identified logic units;

means for electrically isolating the identified drivers from the identified logic units; and means for programming the new configuration into the identified logic units.

16. A reprogrammable logic device having programmable logic units and programmable interconnects connecting the programmable logic units to other portions of the device, wherein a first region of the device may be reprogrammed while a second region of the device continues to operate, the first region of the device being reprogrammable with a new configuration, the device comprising:

means for identifying logic units in the first region to be reprogrammed;

means for identifying drivers in the second region that forward logic signals to the identified logic units in the first region;

means for electrically isolating the identified drivers from the identified logic units; and means for reprogramming the first region of the device with the new configuration.

17. A reprogrammable logic device having a first region in which reprogrammable logic units are located and having a second region in which there are no reprogrammable logic units, the first and second regions being interconnected by programmable interconnects, the programmable logic units being reprogrammable while avoiding signal contention problems, the device comprising:

means for identifying the reprogrammable logic units to be reconfigured;

means for identifying the interconnects connecting the identified logic units with the second region;

means for programming the identified interconnects to electrically isolate the identified logic units from the second region;

means for reconfiguring the identified logic units; and means for programming the identified interconnects to reconnect the reconfigured logic units to the second region.

18. A programmable logic device having reprogrammable logic units and drivers connected to the logic units for delivering logic signals to the logic units, at least one of the logic units being reconfigurable, the device comprising:

means for identifying logic units to be reconfigured;

means for identifying drivers associated with the identified logic units;

means for deactivating the identified drivers while reconfiguring the identified logic units; and means for reactivating the identified drivers.

19. A programmable logic device having reprogrammable logic units of which at least one such unit is to be reprogrammed, the device being reprogrammable while avoiding signal contention problems, the device comprising:

means for determining an initial configuration of the device;

means for comparing the initial configuration with a reprogrammed configuration of the device;

means for determining whether any signal contention will result from the combination of the initial configuration and the reprogrammed configuration;

means for deactivating logic device components to clear any determined signal contention;

means for reprogramming the device; and means for reactivating the deactivated components.

20. A method for generating a bitstream for reconfiguring a reprogrammable logic device from an old configuration to a new configuration, the method comprising:

identifying a plurality of logic units to be reprogrammed;

identifying a plurality of drivers forwarding logic signals to the identified logic units;

generating configuration bitstream frames to electrically isolate the identified drivers from the identified logic units; and generating configuration bitstream frames for the new configuration.

21. A configuration bitstream generated using the method of claim 1.

22. A configuration bitstream generated using the method of claim 5.

23. A configuration bitstream generated using the method of claim 9.

24. A configuration bitstream generated using the method of claim 12.

25. A configuration bitstream generated using the method of claim 14.

26. A configuration bitstream that permits safe reconfiguration of a selected portion of a reprogrammable logic device, the bitstream comprising:

a plurality of data frames for instructing the reprogrammable logic device to electrically isolate selected drivers from the selected portion of the device; and a plurality of data frames for instructing the reprogrammable logic device to configure the selected portion of the device.

* * * * *